(12) United States Patent
Gallagher

(10) Patent No.: US 6,870,087 B1
(45) Date of Patent: Mar. 22, 2005

(54) ASSEMBLY METHOD AND APPARATUS FOR PHOTOVOLTAIC MODULE

(76) Inventor: Patrick Gallagher, 24 Link, NW., Albuquerque, NM (US) 87120

( * ) Notice: Subject to any disclaimer, the term of this patent is extended or adjusted under 35 U.S.C. 154(b) by 129 days.

(21) Appl. No.: 10/245,976

(22) Filed: Sep. 16, 2002

Related U.S. Application Data

(60) Provisional application No. 60/322,939, filed on Sep. 14, 2001.

(51) Int. Cl.[7] .................. H01L 31/052; H01L 31/048
(52) U.S. Cl. .................. 136/246; 136/244; 136/251; 257/433; 257/436; 257/443; 438/80; 438/66; 438/64; 438/73
(58) Field of Search .................. 136/244, 251, 136/246; 257/433, 436, 443; 438/80, 66, 64, 73

(56) References Cited

U.S. PATENT DOCUMENTS

| | | | |
|---|---|---|---|
| 4,126,270 A | | 11/1978 | Hummel |
| 4,231,807 A | * | 11/1980 | Keeling et al. ............. 136/251 |
| 4,774,932 A | | 10/1988 | Hollick |
| 4,899,728 A | | 2/1990 | Peter et al. |
| 4,934,338 A | | 6/1990 | Hollick et al. |
| 5,112,408 A | * | 5/1992 | Melchior ................... 136/251 |
| 5,258,076 A | * | 11/1993 | Wecker ...................... 136/245 |
| 5,259,363 A | | 11/1993 | Peacock et al. |
| 5,505,788 A | | 4/1996 | Dinwoodie |
| 5,589,006 A | | 12/1996 | Itoyama et al. |
| 5,717,255 A | * | 2/1998 | Haga et al. ................ 257/781 |
| 5,935,343 A | | 8/1999 | Hollick |
| 5,998,729 A | * | 12/1999 | Shiomi et al. ............. 136/251 |
| 6,063,996 A | | 5/2000 | Takada et al. |
| 6,065,256 A | | 5/2000 | Joko et al. |
| 6,155,006 A | | 12/2000 | Mimura et al. |
| 6,178,966 B1 | | 1/2001 | Breshears |
| 6,182,403 B1 | | 2/2001 | Mimura et al. |
| 6,201,179 B1 | | 3/2001 | Dalacu |
| 6,268,559 B1 | | 7/2001 | Yamawaki |
| 2003/0094194 A1 | * | 5/2003 | Mattiuzzo ................. 136/244 |

FOREIGN PATENT DOCUMENTS

JP          6-196743 A   *  7/1994

* cited by examiner

Primary Examiner—Alan Diamond
(74) Attorney, Agent, or Firm—Vidal A. Oaxaca; Deborah A. Peacock; Peacock Myers & Adams, PC

(57) ABSTRACT

A photovoltaic (PV) module 10 assembled by automated processes. PV module 10 comprises solar cells electrically connected in a linear string 24. Encapsulant 26 surrounds solar cell string 24. Dielectric 30 is positioned between solar cell string 24 and a layer of encapsulant 26'. A glass layer is placed atop encapsulant 26. A terminal bar 19 is in electrical continuity with the electrical output of the solar cell at each end of solar cell string 24. Circuit connector 20 is in electrical continuity with terminal bar 19 and is used for electrical connection of one module to another in the field. Solar cell string 24 is mounted in a box-like structure comprised of an upper pan 14 and lower pan 16. Lower pan 16 defines a conduit for the flow of air beneath solar cell string 24. Module 10 is rotatably mountable in sunlight tracking array 100.

21 Claims, 9 Drawing Sheets

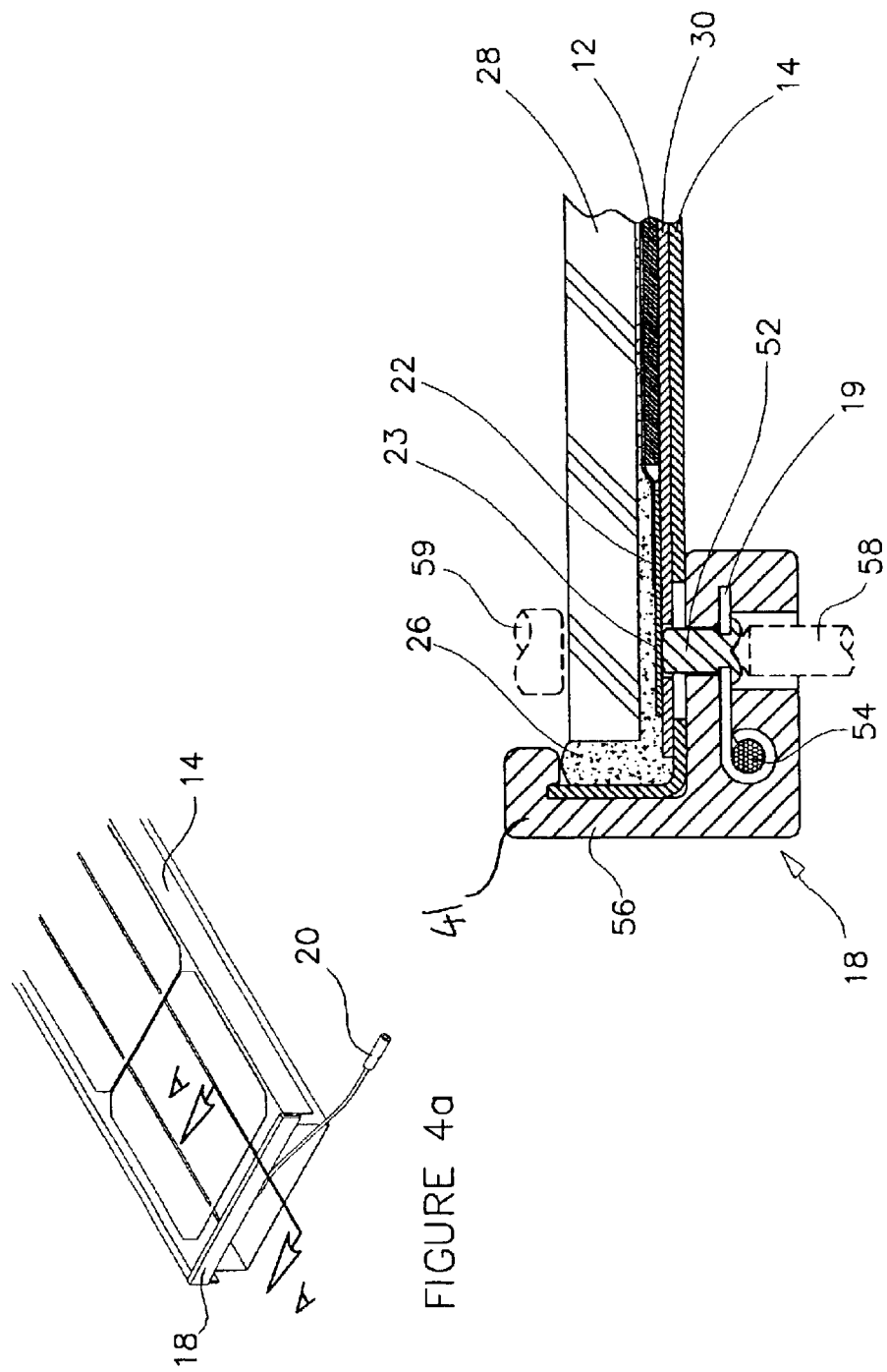

ASSEMBLY METHOD AND APPARATUS FOR PHOTOVOLTAIC MODULE

CROSS-REFERENCE TO RELATED APPLICATIONS

This application claims priority to U.S. Provisional Patent Application Ser. No. 60/322,939, entitled "Combination Photovoltaic, Thermal Solar Panel and Roofing Material", to Gallagher, filed on Sep. 14, 2001, and the specification thereof is incorporated herein by reference.

BACKGROUND OF THE INVENTION

1. Field of the Invention (Technical Field)

The present invention relates to the field of photovoltaic modules, in particular to photovoltaic modules amenable to automated assembly for utilization in a fixed or sunlight-tracking array.

2. Background Art

Photovoltaic (PV) modules, also referred to as PV "panels" or "collectors" are used to collect sunlight for conversion into useful forms of energy, particularly for the generation of electricity for use in industrial applications and homes. The typical PV module has remained relatively unchanged from its original configuration of approximately thirty years ago. FIGS. 7a and 7b are representative of a prior art PV module, where FIG. 7a shows a perspective view of the prior art PV module and FIG. 7b shows an exploded view of the module of FIG. 7a. Referring to FIG. 7b, the prior art PV module is comprised of an array of sliced crystalline or semicrystalline silicon solar cells 300. Each cell 300 converts photons that strike the cell into a flow of electrons. The electrons flow across the cell on a grid pattern (not shown) as electrical current, the current being channeled to a pair of redundant parallel bus bars 302, 302' also referred to as "interconnects", on each cell. The electrical current then flows through the bus bars 302, 302' from one solar cell to the next. Each cell 300 is thus oppositely polarized at opposing ends creating a relatively small voltage across the cell, typically approximately one-half of a volt. Because of the small voltage across each individual solar cell, PV modules comprise a plurality of solar cells connected in series to attain useful voltages such as 120 volts or 240 volts. Electrical current flowing through each solar cell is approximately five to six amperes.

The solar cells of a PV module are electrically connected end-to-end in series in a "string" so that the voltage from each cell is added to the voltage of the adjacent cell. These strings, or rows, of cells are then placed adjacent to one another, each row of cells being electrically connected in series with the adjacent row by a bus bar as indicated at 304. The resulting array is therefore one continuous series of solar cells arranged in a serpentine manner as shown in FIG. 8. Sometimes, the PV strings are connected in a series/parallel combination.

This array of solar cells is encapsulated within a transparent polymer 306, 306' to seal the solar cells from the elements. The encapsulant is in turn sandwiched between tempered glass 308 on the front surface where photons strike and a polymer sheet 310 on the back surface. This panel 310 provides a moisture barrier. An aluminum frame 312 protects the perimeter of the tempered glass 308 on the front surface of the PV module and also provides a mounting frame for the module. A junction box 314 provides the electrical connection to the module.

Fabrication of the individual solar cells and the assembly, or "stringing", of cells together in series is typically performed in an automated fashion. The remaining manufacturing tasks are less amenable to automation. In particular, the connection of one string of solar cells to the next in a serpentine fashion requires an assembly technician to manually connect the end of one string to another via a suitable conductor. In particular, there are three facets of the prior art PV module configuration that make automated assembly difficult: 1) Every other string must be turned around so that its electrical polarity forms a continuous serpentine series electrical circuit. Turning the strings requires a large amount of factory space and is fraught with opportunity to damage the circuit. 2) Placing a turned string next to the adjacent string requires precision and the ability to ensure that it has been placed correctly. If the strings are not spaced apart adequately, solar cells in adjacent strings can be damaged; however, if the strings are not spaced close enough together, the array will not fit into the frame 312. 3) A terminal bar must be placed at the ends of adjacent strings and soldered into the overall circuit to make the series chain complete. To perform these tasks automatically requires a large capital expense in the form of robots or other programmable equipment capable of performing precise and complex maneuvers. The result has been that the expense of manufacturing PV modules renders large-scale production of PV modules cost-prohibitive.

Another limitation of prior art PV modules occurs when in use in the field. Most PV modules are fixed in position relative to the angle of incidence of the sun. When sunlight strikes the module at a shallow angle, the conversion of photons to a flow of electrons is less than optimal. PV modules convert photons to electrons most efficiently when sunlight strikes the PV module normal to the surface of the PV module. Prior art PV modules have attempted to address this issue by mounting the entire array of solar cells on a fulcrum and causing the array to pivot on the fulcrum in accordance with movement of the sun. One limitation of this configuration is the cumbersome nature of pivoting the entire PV array. Space limitations in a residential application may prohibit movement of the array. The torque and control means required to pivot the array especially under winder wind-loading can also make such an array cost-prohibitive. Another limitation of this configuration is shadowing. At the end of a day, certain obstructions, such as houses or trees, can produce a shadow on modules. Once any one solar cell entirely shadowed it ceases its electrical output, thereby opening the series circuit and inhibiting the entire series string from producing current.

Pivoting individual multi-string modules about their own axes is limited because adjacent modules shadow the cells along the extreme edges of the individual modules at the beginning and end of the day. Once one string is in shadow, the entire system ceases the flow of electrons because they are in series. Utilities have built multiple adjacent tracking systems wherein significant space between arrays is allotted to minimize the effect of shadowing. Such liberal use of space is generally not acceptable on residential and individual buildings.

The present invention for a combination PV, thermal solar panel and roofing material overcomes the limitations of the prior art and eliminates the manufacturing issues described above. The present invention for a PV module is assembled by an automated process, resulting in reduced assembly cost as compared to prior art PV modules. The present invention can be readily incorporated into a sunlight-tracking apparatus wherein each PV module is pivoted about a longitudinal axis in relation to the angle of incidence of sunlight striking the module. The present invention can also be used for the separate functions of collecting sunlight, collecting excess radiated heat from the sun and channeling it to an appropriate location, and providing a roofing material.

SUMMARY OF THE INVENTION
(DISCLOSURE OF THE INVENTION)

The present invention is a photovoltaic (PV) module assembled by automated processes. The PV module of the present invention is comprised of solar cells electrically connected in a linear series circuit. A terminal bar assembly is affixed to each end of the module. A terminal bar within the terminal bar assembly is in electrical continuity with the electrical output of the solar cell at the end of the solar cell circuit. A circuit connector is in electrical continuity with the terminal bar and is used for electrical connection of one module to another in the field.

The solar cell string is mounted in a rigid structure comprised of an upper pan and lower pan. The solar cell string is mounted in the upper pan. The lower pan defines a conduit for the flow of air beneath the solar cell string.

Due to the weatherproof nature of the PV module of the present invention it can be utilized as a roofing application in addition to providing electrical energy from sunlight. The PV module of the present invention is further rotatably mountable in a sunlight-tracking array. When mounted in the sunlight tracking array, each PV module is individually rotated by a common actuator and linkage, about a longitudinal axis of the module in relation to the movement of the sun across the sky.

A primary object of the present invention is to provide a PV module that is amenable to automated assembly. Another primary object of the present invention is to provide a PV module that is amenable to operation in a solar tracking device. Yet another primary object of the present invention is to combine the functions of sunlight collection, heat collection, and roofing into a single apparatus.

A primary advantage of the present invention is that automated assembly reduces the cost of the PV modules of the present invention. Another primary advantage of the present invention is that it eliminates the frame required in prior art PV modules as well as the precision spacing and manual electrical connection performed during the assembly of prior art PV modules. Yet another primary advantage of the present invention for a PV module is that it is easily adapted to a solar tracking device to obtain maximum direct sunlight at all times of day. Still another primary advantage of the present invention is that the cost of electricity produced by the PV modules of the present invention is reduced due to the added features of roofing protection and interior space heating.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 4a is a perspective view of a portion of the preferred embodiment of the PV module of the present invention;

FIG. 4b is a cross-sectional view of the PV module of the present invention taken through A—A of FIG. 4a;

FIG. 7b shows an exploded view of the PRIOR ART PV module of FIG. 7a;

DESCRIPTION OF THE PREFERRED EMBODIMENTS (BEST MODES FOR CARRYING OUT THE INVENTION)

The present invention is a PV, thermal module comprised of a single linear string of solar cells preferably connected in series and assembled by a unique automated assembly process. As unsed herein, "linear" is defined as a straight line, as opposed to a serpentine arrangement. The apparatus of the present invention is described first and the assembly thereof, second.

Figure 1:
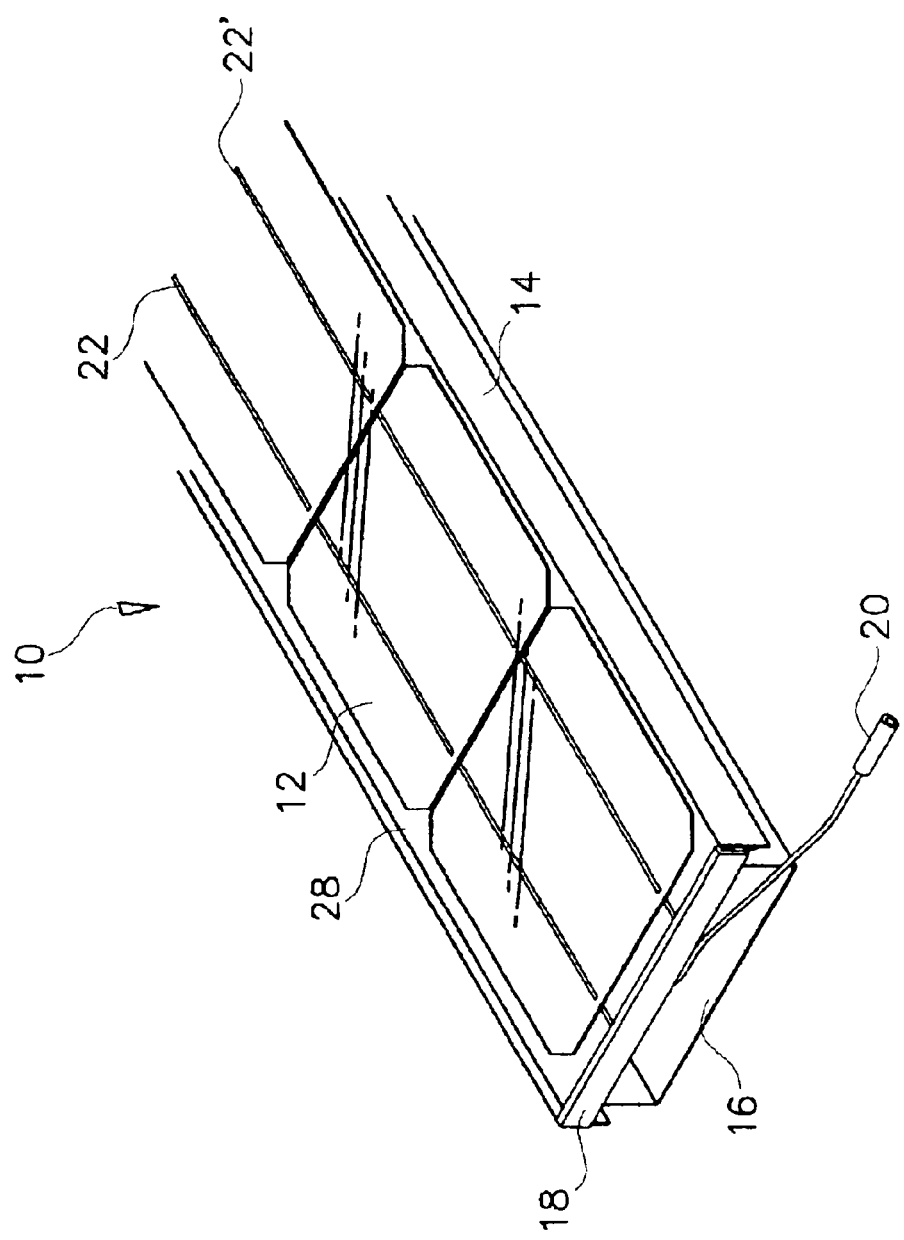
FIG. 1 is a perspective view of a portion of the preferred embodiment of the present invention for a PV module.

Referring to FIG. 1, a perspective view of a portion of the present invention for a PV module 10 is shown. The basic components of module 10 are a single string of solar cells, one solar cell referred to at 12, upper pan 14, lower pan 16, terminal bar assembly 18, 18', and circuit connector 20, 20'. Solar cells 12 are preferably connected in series via interconnects 22 and 22' through which electrical current flows. Solar cells 12 can of course be connected in parallel or in series/parallel combinations as will be understood by those of skill in the art. Interconnects 22 terminate at terminal bar assembly 18, 18' at each end of module 10. Circuit connector 20, 20' is electrically connected to terminal bar 19 (see FIG. 4b) of terminal bar assembly 18, 18' and provides an efficient manner of electrically connecting module 10 to another PV module (not shown).

Figure 2:
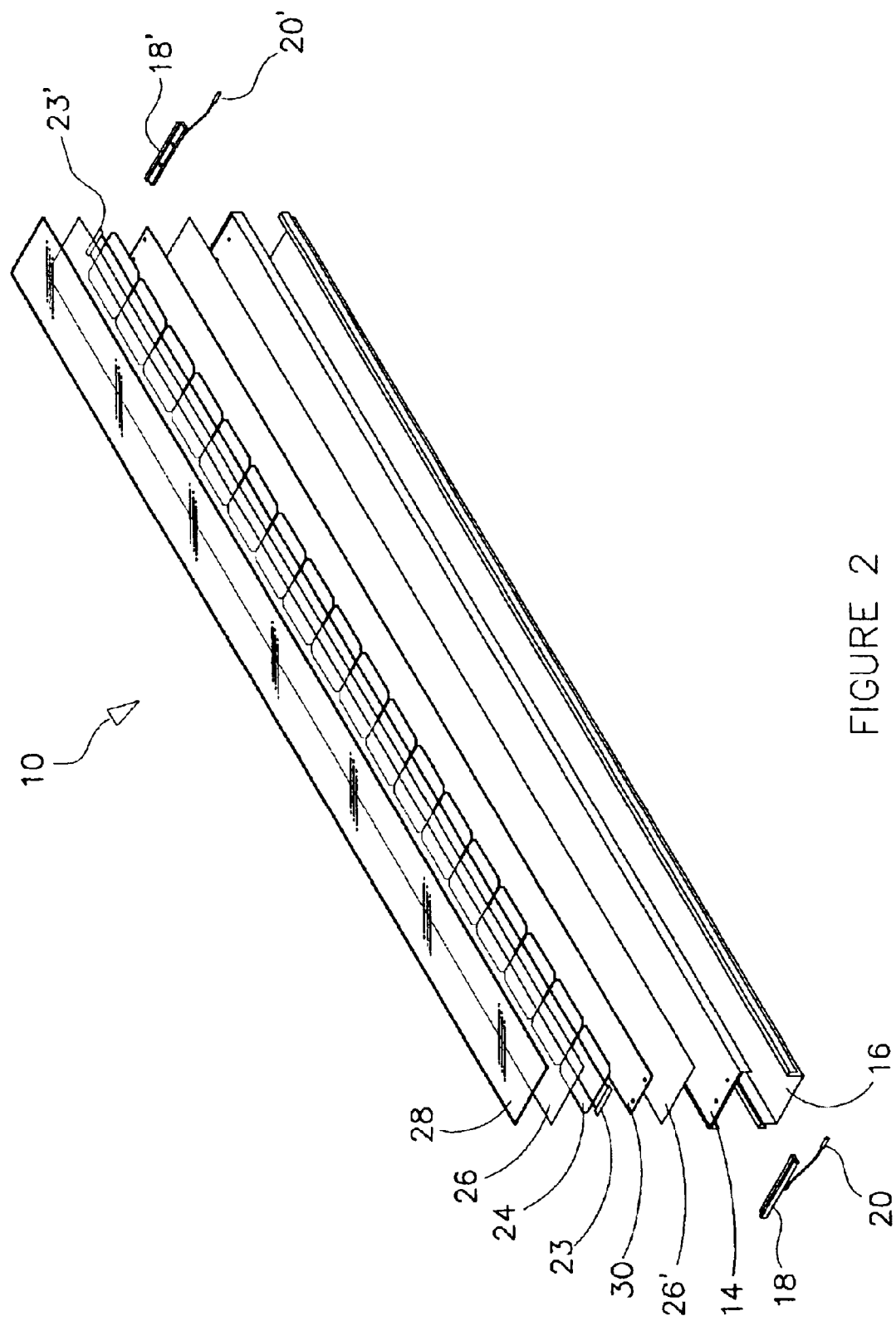
FIG. 2 is an exploded view of the preferred embodiment of the PV module of the present invention.

FIG. 2 provides an exploded view of module 10 for ease of viewing the components of module 10. Referring to FIG. 2, a string of solar cells 24 of module 10 are positioned between encapsulant layers 26 and 26'. Glass layer 28 is positioned atop encapsulant layer 26 on the front surface of module 10. Glass layer 28 preferably comprises 1/8 inch thick tempered glass or equivalent sufficiently transparent material. Dielectric layer 30 is positioned between encapsulant layer 26' and solar cells 24. Dielectric layer 30 provides an electrical conductivity barrier to prevent electrical continuity from inadvertently occurring between any of solar cells 24, interconnects 22, and upper pan 14. Upper pan 14 provides a mount for solar cells 24 as well as longitudinal rigid support for module 10. Upper pan 14 provides a mount for solar cells 24 as well as longitudinal rigid support for module 10. Lower pan 16 is positioned beneath upper pan 14 and provides a conduit for the flow of air beneath upper pan 14 in a longitudinal direction along module 10. Lower pan 16 also provides rigid structural support for module 10. Upper pan 14 and lower pan 16 are preferably formed from approximately 0.020 to 0.024-inch thick sheet metal, such as galvanized steel or comparable corrosion-resistant material, having a zinc-based coating, stainless steel, or a polymer. Terminal bar assembly 18 is connected to upper pan 14 and provides electrical continuity with interconnects 22 of solar cells 24 by way of internal buce bar 23 (see FIG. 4b), as described further below.

Figure 3A:
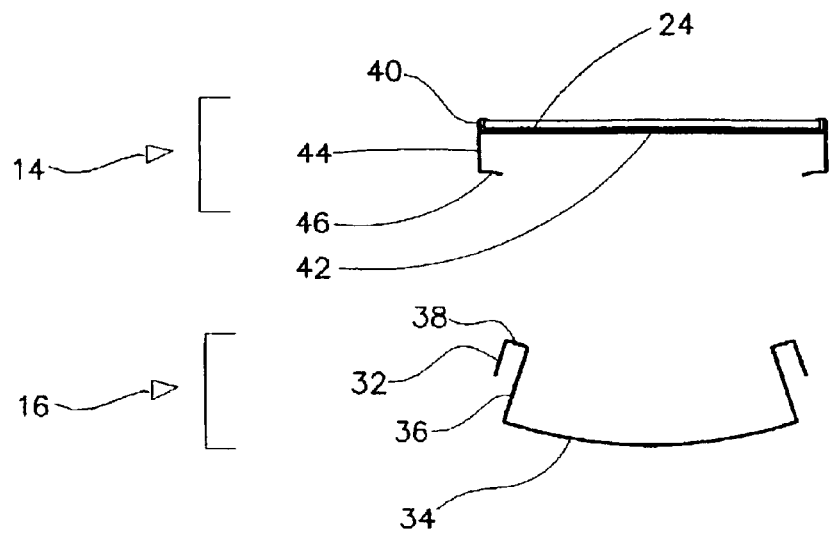
FIG. 3a is an end-view of the preferred embodiment of the upper pan and lower pan that are used in accordance with the present invention, prior to assembly.
Figure 3B:
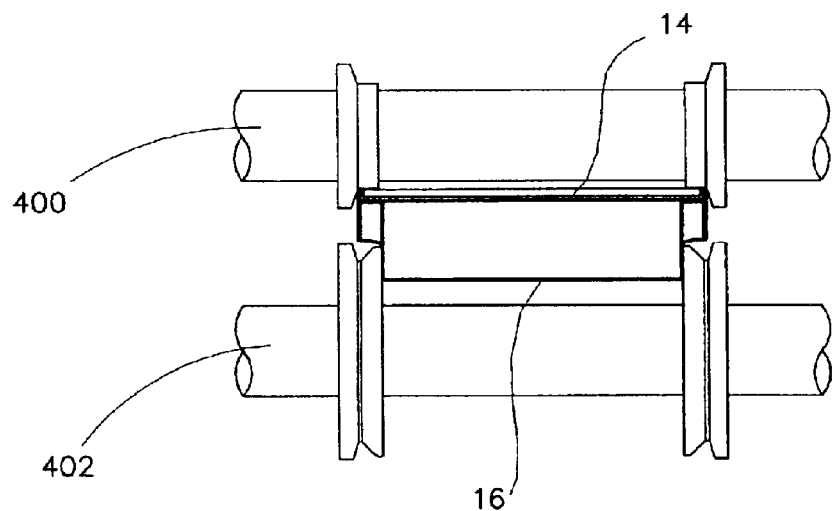
FIG. 3b is an end-view of the upper pan and lower pan of the present invention during the seaming process.
Figure 3C:
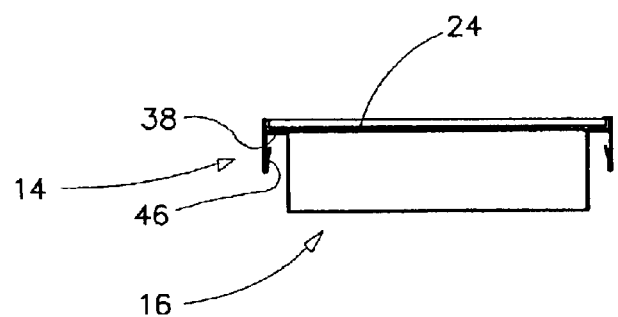
FIG. 3c is an end-view of the upper pan seamed to the lower pan for incorporation into the present invention for a PV module.

Assembly of lower pan 16 to upper pan 14 is described here to demonstrate the rigid, box-like structure used to support solar cell string 24. The remaining assembly process is described in detail below. Referring to FIGS. 3a, 3b and 3c, an end-view of upper pan 14 and lower pan 16 is shown revealing the pre-assembly configuration of upper pan 14 and lower pan 16 as well as the final seamed assembly of upper pan 14 to lower pan 16. Referring to FIG. 3a, an end-view of upper pan 14 and lower pan 16 is shown prior to assembly. Upper pan 14 comprises a planar surface 42 atop which solar cell string 24 is placed and laminated. Upward flange 40 extends from planar surface 42 of upper pan 14 along the length of upper pan 14 to support solar cell string 24. Down-standing flange 44 extends from upward flange 40 beyond and below planar surface 42 of upper pan 14. Down-standing flange 44 will extend around the outer perimeter of lower pan 16 during assembly of upper pan 14 to lower pan 16. Crimp-flange 46 extends from downstanding flange 44 and will be folded around the outermost flanged portion 32 of lower pan 16 during assembly.

Lower pan 16 is shown prior to assembly to upper pan 14 deformed from its natural rectangular configuration in order to be fit into upper pan 14. Lower pan 16 comprises a bottom surface 34, an upward flange 36 extending from bottom surface 34, and horizontal surface 38 extending from upward flange 36. Outermost flanged portion 32 fits within downstanding flange 44 of upper pan 14 during assembly of lower pan 16 to upper pan 14 as shown in FIG. 3b.

Referring to FIG. 3b, an end-view of the assembly of upper pan 14 and lower pan 16 is shown using a roll-forming process. Seaming rolls 400 and 402 seam lower pan 16 within upper pan 14. Once lower pan 16 is inserted into upper pan 14, the spring-force of lower pan 16 returns it to its original rectangular configuration. Horizontal surfaces 38 of lower pan 16 are pressed against planar surface 42 of upper pan 14 and are positioned between down-standing flanges 44 of upper pan 14. A second or third pair of seaming rolls (not shown) are required to complete the operation.

Referring to FIG. 3c, an end-view of upper pan 14 seamed to lower pan 16 is shown. After lower pan 16 is pressed into upper pan 14 as depicted in FIG. 3b, crimp-flanges 46 of upper pan 14 are folded upward around outermost flanged portion 32 of lower pan 16 to form a crimped joint between the pans. The assembly of lower pan 16 to upper pan 14 results in a rigid, weathertight, box-like structure that supports solar cell string 24.

Figure 7A:
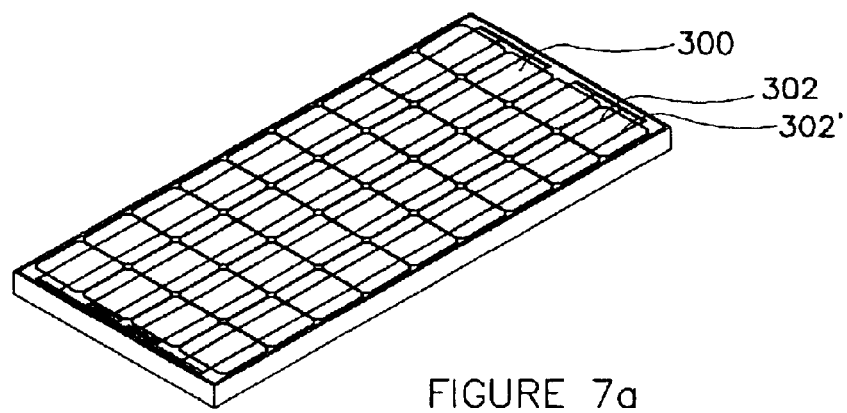
FIG. 7a shows a perspective view of a PRIOR ART PV module.
Figure 7B:
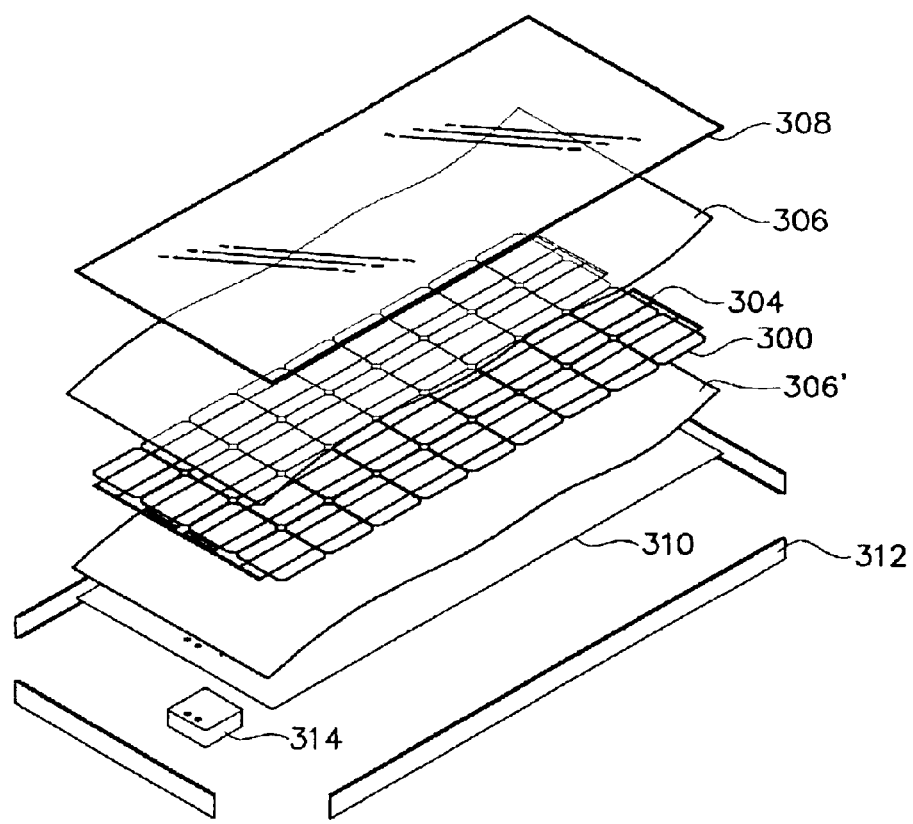
Figure 8:
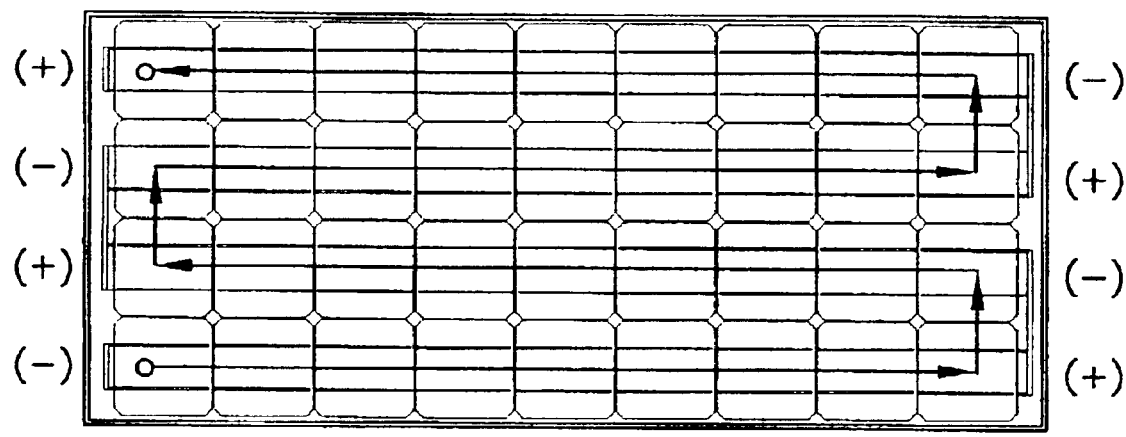
FIG. 8 is a diagram showing the serpentine series array of the PRIOR ART PV module of FIG. 7.

The configuration of upper pan 14 eliminates the requirement of containing and trimming excess encapsulant that emanates from the edges of a PV module during lamination. The combined assembly of upper and lower pans 14 and 16 also eliminates the need for a separate frame such as that of the prior art depicted in FIG. 7b to protect the glass of the PV module. The rectangular box-shape of the upper and lower pans is rigid and strong enough to resist damage during handling, installation in the field, and the effects of inclement weather.

Referring to FIG. 4b, a cross-sectional view of module 10 and the means for electrical connection of module 10 is shown taken through A—A of FIG. 4a, revealing the internal components of terminal bar assembly 18. Solar cell 12 is above upper pan 14 and glass layer 28 is above solar cell 12. Encapsulant 26 surrounds solar cell 12.

Interconnect 22 is in electrical contact with internal bus bar 23 which is in turn in electrical contact with terminal lug 52. Terminal lug 52 is an extension of terminal bar 19 and passes through an opening defined in upper pan 14 to connect to internal bus bar 23. Attached and in electrical continuity with terminal bar 19 is circuit connector 20. Circuit connector 20 preferably comprises a wire 54, such as that commonly referred to as a "pigtail", connected to terminal bar 19 and having an appropriate electrical connector at its free end.

Terminal bar 19 is housed within housing 56 which comprises a non-conductive material. Terminal bar assembly 18 is partially supported by upward flange 41 that extends from planar surface 42 of upper pan 14 along the width of the end of upper pan 14.

During assembly of module 10, a terminal soldering tool, depicted at 58, is inserted through an opening defined in terminal housing 56 and is used to connect terminal lug 52 and internal bus bar 23 as described below in the assembly process. Each end of module 10 has a terminal bar 19, terminal lugs 52, and circuit connector 20 assembled in this manner.

Unlike the prior art, the present invention is not assembled into an array in a frame at the factory. Instead, individual modules 10 are taken to the field for installation. The connectors 20 at the ends of the modules 10 are marked (+) or (−) as appropriate. To install the modules in the field, a technician connects the module connectors 20, (+) to (−), to build an array of modules as needed for the application. This design eliminates the frame required in prior art PV modules as well as the precision spacing and manual electrical connection performed during the assembly of prior art PV modules.

Figure 5:
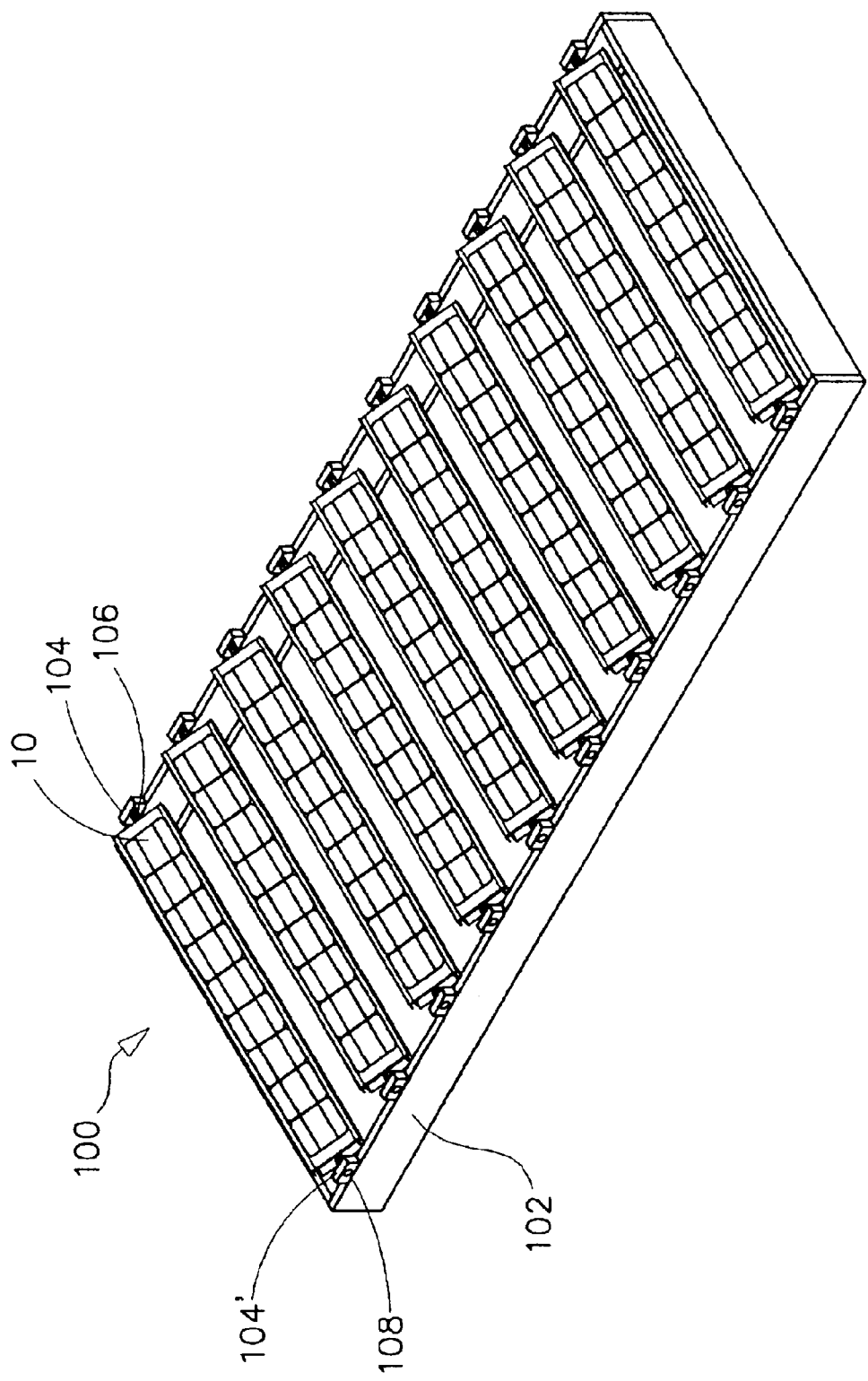
FIG. 5 is a perspective view of the preferred embodiment of the present invention for a sunlighttracking array comprising a series of the PV modules of the present invention.

Referring to FIG. 5, a perspective view of a sunlight-tracking array 100 comprising PV modules is shown, where each module 10, one solar cell in width, tracks the path of the sun as it travels across the sky during daylight hours. Due to the single-cell width of each module 10 of tracking array 100, it does not suffer from shadowing from adjacent modules as in the prior art. PV modules 10 of array 100 are electrically connected to one another in a series circuit arrangement, but can be connected in a parallel arrangement, or series/parallel arrangement. Array 100 contnues to produce current until all solar cells are simultaneously darkened at sunset.

In tracking array 100 a series of PV modules 10 are positioned parallel to one another and rotatably mounted to frame 102. Frame 102 preferably comprises two parallel longitudinal walls and two parallel end walls forming a substantially rectangular frame of sufficient rigidity to support the PV modules. Alternative configurations for frame 102 will be apparent to those of skill in the art. Each module 10 is mounted to a surface of frame 102 by mounting means 104, 104'. Mounting means 104, 104' define an opening for receiving axial extension 106 at a first end of module 10, and axial extension 108 at the opposite end of module 10, where each axial extension extends from and is affixed to module 10. Actuator means (not shown) provides sufficient torque to a linkage (not shown) which causes axial extension 108 to rotate according to a predefined rate and schedule for tracking the movement of the sun. As axial extension 108 rotates, module 10 pivots about an axis defined between extensions 106 and 108. Modules containing nine approximately five-inch square solar cells and comprising conventional materials for the other components of module 10 weigh approximately ten pounds requiring a relatively small amount of torque from the actuator.

When installed on a flat-roof, sunlight-tracking array 100 is not visible from ground level due to the small height of each module 10. Even at the greatest incident sunlight angles, the height of array 100 is minimal. Also, because of the small height dimension of array 100, it is protected from wind damage particularly when the building has parapets.

Figure 6:
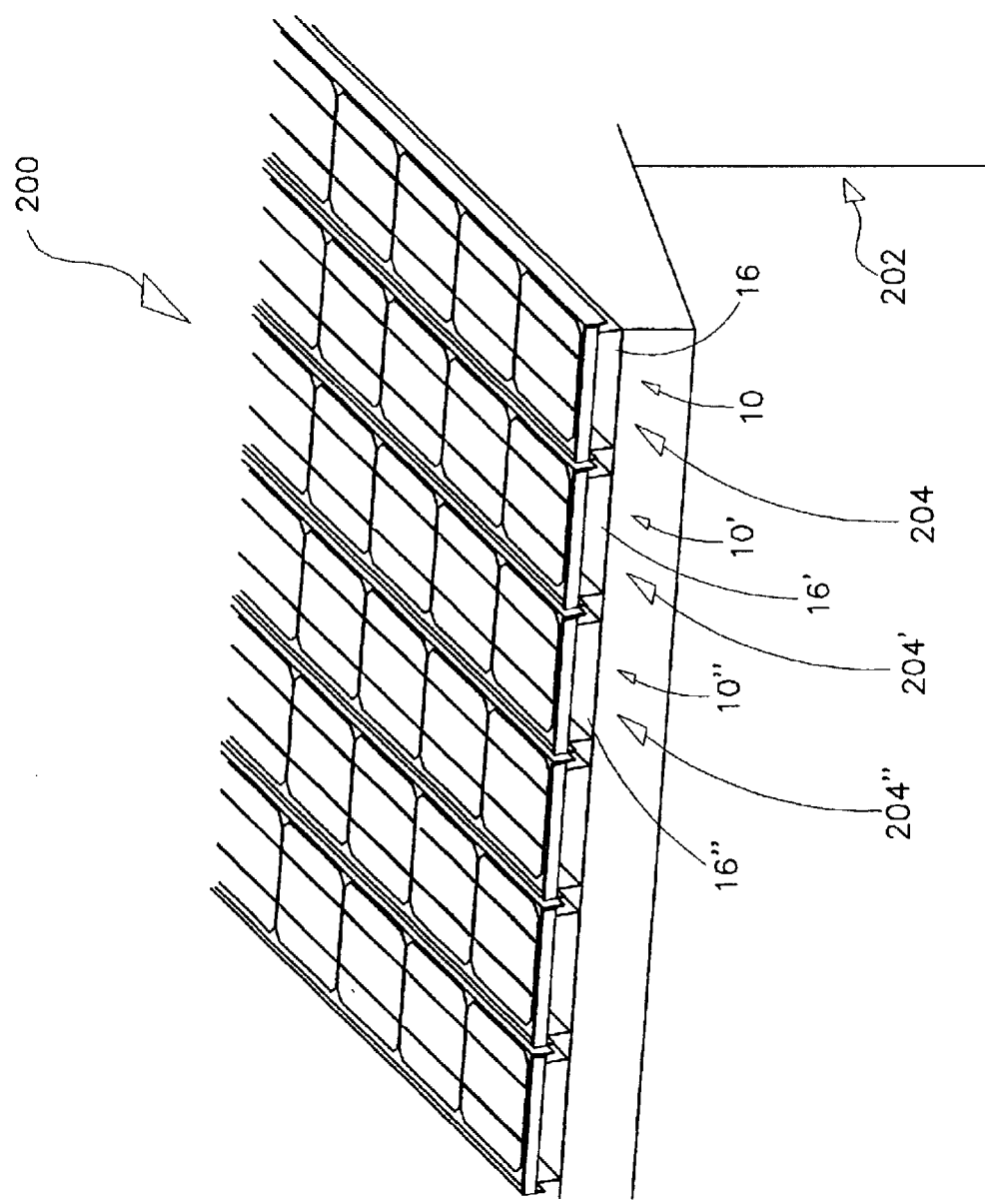
FIG. 6 is a perspective view of an array of PV modules of the present invention installed as a roof for a structure.

Referring to FIG. 6, a perspective view of the present invention for a PV module 10 as a roofing application 200 is shown. A series of modules 10, 10', etc. are placed adjacent and parallel to one another and in electrical continuity to provide PV power as well as a roofing material for a structure 202 such as a residential dwelling. As discussed above with respect to FIGS. 1 through 4, the assembly of module 10 provides a barrier to the elements.

An additional feature of roofing application 200 is the thermal transfer of air heated by the instance of sunlight on modules 10 into the interior of the building structure 202. Cool air depicted at 204 enters the conduit defined by lower pan 16 of each module 10 and flows beneath the solar cells of each module 10 becoming heated as it travels beneath the cells. As the heated air flowing beneath the solar cells of roofing application 200 rises to the apex of the roof of structure 202, it is pulled down into the interior of structure 202 by a fan or blower through a duct extending from the roof into the structure interior. The heated air is collected by a plenum commonly connected to all modules 10 of roofing application 200. The plenum is connected to the duct that feeds the heated air into the interior of structure 202.

As the temperature of solar cells increases, their efficiency decreases. Removing the heated air from beneath the solar cells and allowing cool air to flow in its place improves the efficiency of the PV modules. During summer, or other times of increased ambient temperature, the unwanted heated air is discharged from the plenum to the atmosphere through movable doors at each end of the plenum. An optional fan or blower is included to assist this discharge activity.

The unique structure of the present invention for a PV module 10, allows for automated assembly which is now described with reference to FIGS. 1 through 4.

Structural support for module 10 is preferably comprised of zinc-coated, steel sheet metal that is roll-formed into the upper pan 14 and lower pan 16. Roll-forming is a mature and common process used heavily in the building construction industry to form rain gutters, wall studs and roofing. A coil (industry parlance for a roll) of sheet metal is introduced into the roll-forming machine, centered, and then deformed by a series of opposed rollers spaced in a manner to transform the ribbon of sheet metal into the final shape. Because the upper and lower pans are shaped differently, two different sets of rolls are required. The final shapes for each of the upper and lower pan are sheared into proper lengths. Holes for terminal bar 19 are punched and a flange is formed on each end of the upper pan 14. Lower pan 16 is sheared without any secondary operations.

The upper and lower pans are not assembled into a structural box, or rectangular channel, at this point in assembly. Upper pan 14 is cleaned and a small piece of tape is placed over the punched holes to inhibit leakage of melted encapsulant during lamination. Upper pan 14 is then positioned for receiving the first application of sheet encapsulant 26' (see FIG. 2).

Dispensed from a roll of the correct width, encapsulant 26' is placed in pan 14 and sheared to length. Encapsulant 26' adheres to pan 14 during lamination. To effect placement of encapsulant 26' upon pan 14, the roll of encapsulant is moved along the length of the pan while it is in a fixed position, or the pan is moved beneath the fixed roll of encapsulant.

From a roll of dielectric material of the correct width, a strip of dielectric 30 is punched to match the holes in pan 14, sheared, and placed atop the layer of encapsulant 26' in upper pan 14. It is within the skill of the art to combine encapsulant and dielectric into one roll to reduce the number of application devices and steps required in the assembly process.

Assembly of the PV modules of the present invention does not include fabrication of the individual solar cells. Pre-manufactured solar cells are introduced to the assembly process in stacks from which they are soldered into a circuit, or string 24 (see FIG. 2). An internal buss bar 23 (see FIG. 4b) is then soldered to the interconnect ribbons 22 extending from each end of string 24.

String 24 is then placed into upper pan 14 atop the dielectric, or combined dielectric/encapsulant layer. Placement of string 24 need only be precise enough to insure that the internal bus bars 23 cover the holes, or openings, in the upper pan 14 where the terminal bar 19 is later connected (see FIG. 4b). The second layer of encapsulant 26 is now applied to module 10 atop string 24 in the same manner as the first layer of encapsulant 26 was applied.

A sheet of tempered glass 28, or other sufficiently transparent material, is cleaned and placed on the second encapsulant layer 26 to complete the "layup" of module 10. The assembly of module 10 is then ready to be laminated.

The lamination process removes air from the layers, melts the encapsulant and compacts the layup into a hermetically sealed, weatherproof package. This process is similar to the manner in which automotive windshields are made into "safety glass." Typically, PV modules are laminated in a vacuum chamber with a silicone rubber blanket above the glass 28. Initially, air surrounding module 10 is evacuated. Then, module 10 is raised to a temperature high enough to melt the encapsulant. Finally the space above the silicone blanket is allowed to fill with air at a pressure greater than that which is in the evacuated portion of the chamber. This applies uniform pressure to the glass 28 of module 10 to compact the layers of module 10. Module 10 is then removed from the chamber and allowed to cool. The shape of upper pan 14 determines the shape of the heating surface used in the laminating chamber. The heating plate must be narrow enough to fit in the space between the downstanding flanges 44 of upper pan 14.

Terminal bar assembly 18 is assembled to module 10 next. Terminal bar assembly 18 is designed to be partially supported by an upward flange 41 at each end of upper pan 14 (see FIG. 4b). Terminal bar assembly 18 is first placed over upward flange 41, then rotated about its long axis until terminal lugs 52 contact the tape used to cover the holes in upper pan 14. A soldering tool 58 then enters the opening through terminal bar housing 56 and the opening in the underside of terminal bar 19, making contact with terminal lug 52 and heating it. The heated terminal lug 52 melts through the tape and encapsulant to come in contact with the internal bus bar 23 at the end of the string 24. Soldering tool 58 includes backup pad 59 that places pressure on glass 28 opposite to where the soldering is to occur. Soldering tool 58, 59 is closed on the laminate; solder on the lug 52 melts into the solder on internal bus bar 23 and lug 52 is bonded to internal bus bar 23. Soldering tool 58, 59 is then removed and module 10 is "flash" tested.

Module 10 is a complete electrical circuit at this stage of assembly, able to convert light to electrical energy. Pins connected to the appropriate instrumentation enter the same openings in housings 56 and terminal bars 19 that were used for soldering to make contact with the terminal lugs 52. A calibrated light is then flashed upon the solar cells of the module to produce a record of the module's electrical output performance. The module is then combined with the lower pan 16.

Upper pan 14 and lower pan 16 are configured to be seamed together mechanically as described above with reference to FIGS. 3a, 3b and 3c. Alternatively, upper pan 14 and lower pan 16 can be combined with adhesive.

Industrial Applicability:

The invention is further illustrated by the following non-limiting examples.

EXAMPLES

Figure 9:
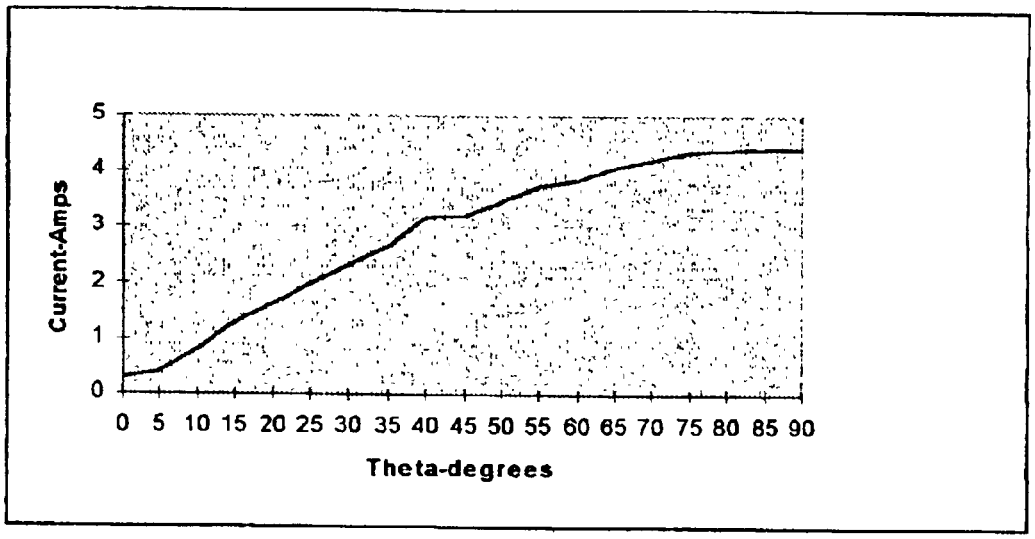
FIG. 9 is a graph depicting the results of the electrical current output from a prototype PV module designed in accordance with the present invention as a function of the angle of incidence of sunlight.

A subscale PV module of the present invention was assembled with four solar cells. Data was obtained on a Sun DC Ammeter Model AM2, and a controlled tilting table was used for control of the angle of incidence of sunlight. The results of the output electrical current from this module as a function of light angle of incidence are shown in FIG. 9. The peak output current obtained was 4.45 amperes in direct sunlight.

Figure 10:
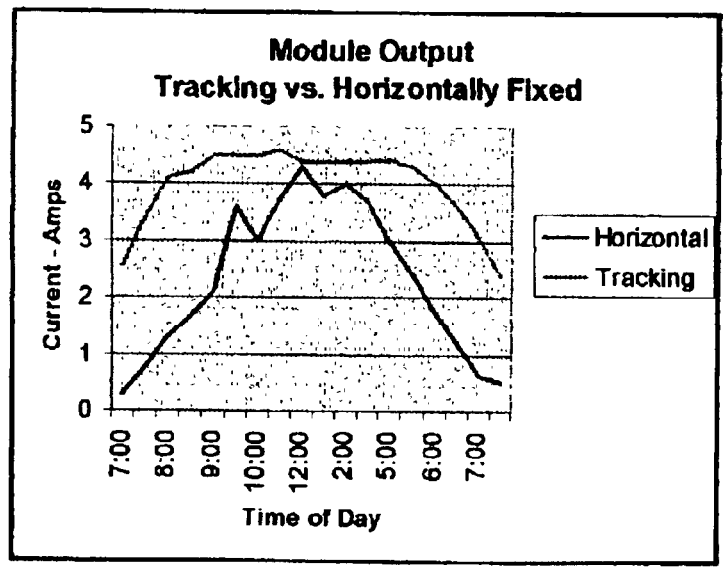
FIG. 10 is a graph where time of day is shown on the horizontal axis and output current is shown in amperes on the vertical axis, and where the bottom plot of the graph represents the output from the horizontal, non-tracking PV module designed in accordance with the present invention, while the upper plot represents the PV module designed in accordance with the present invention as configured to track sunlight.

The results of tracking tests using the PV module of the present invention mounted horizontally in sunlight as well as mounted in a tracking device to follow the sun provided the basis for estimating the electrical current output of the module as a function of the time of day. The results are shown in FIG. 10. Referring to FIG. 10, time of day is shown on the horizontal axis and output current is shown in amperes on the vertical axis. The bottom plot represents the horizontal, non-tracking PV module while the upper plot represents the tracking PV module.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of any references, applications, patents, and publications cited above are hereby incorporated by reference.

What is claimed is:

1. A photovoltaic module comprising:
   a plurality of solar cells, said cells electrically connected in a linear series circuit;
   a terminal bar located at each end of said linear series circuit;
   an electrical connector connected to each terminal bar;
   a upper pan and a lower pan; and
   at least one of said pans forming a support structure for said solar cells,
   wherein said photovoltaic module is part of a sunlight-tracking array.

2. The photovoltaic module of claim 1 wherein said electrical connector connected to each terminal bar comprises a positive electrical connector connected to a first end of said linear series circuit and a negative electrical connector connected to a second end of said linear series circuit.

3. The photovoltaic module of claim 1 wherein said electrical connector comprises a pigtail connector.

4. The photovoltaic module of claim 1 further comprising means for rotating said photovoltaic module about a longitudinal axis of said module.

5. The photovoltaic module of claim 1, said upper pan supporting said plurality of solar cells and comprising at least one material selected from the group of materials consisting of metals and polymers.

6. The photovoltaic module of claim 5 wherein said lower pan comprises a conduit for the flow of air beneath said solar cells.

7. The photovoltaic module of claim 1 wherein said upper pan and said lower pan in combination comprise a crimped joint between said upper pan and said lower pan.

8. The photovoltaic module of claim 1 wherein said terminal bar comprises:
   an approximately planar electrically conductive material;
   a terminal lug extending from said conductive material; and
   an electrical connection between said terminal lug and the output of an end of said linear series circuit.

9. The photovoltaic module of claim 8 wherein said electrical connection comprises:
   an internal bus bar electrically connected to the output of an end of said linear series circuit; and
   an electrical connection between said terminal lug and said internal buck bus bar.

10. The photovoltaic module of claim 1 wherein said upper pan and said lower pan are connected.

11. A method of assembling a photovoltaic module, the method comprising:
    electrically connecting a plurality of solar cells in a linear series circuit;
    electrically connecting a terminal bar to each end of the linear series circuit;
    electrically connecting an electrical connector to each terminal bar,
    structurally supporting the module with an upper pan and a lower pan; and tracking
    rotating the photovoltaic module about a longitudinal axis of the module.

12. The method of claim 11 wherein electrically connecting an electrical connector to each terminal bar comprises electrically connecting a positive electrical connector to a first end of the linear series circuit and electrically connecting a negative electrical connector to a second end of the linear series circuit.

13. The method of claim 11 wherein electrically connecting an electrical connector to each terminal bar comprises electrically connecting a pigtail connector to each terminal bar.

14. The method of claim 11 further comprising supporting the plurality of solar cells with the upper pan.

15. The method of claim 14 further comprising forming a conduit for the flow of air beneath the solar cells through the lower pan.

16. The method of claim a 11 wherein supporting the module with an upper pan and a lower pan comprises crimping the upper pan and lower pan together.

17. The method of claim 14 wherein electrically connecting a terminal bar to each end of the linear series circuit comprises:

provinding a terminal bar comprising an electrically conductive material formed into an approximately planar configuration and having a terminal lug extending from the planar configuration; and electrically connecting the terminal lug to the electrical output of the solar cell at an end of the series circuit.

18. The method of claim 17 wherein the step of electrically connecting the terminal lug to the electrical output comprises:

electrically connecting an internal bus bar to the electrical output of the solar cell;

providing solder upon at least the terminal lug or the internal bus bar, defining at least one opening in a surface of the upper pan;

extending the terminal lug through an opening defined in the upper pan; and heating the terminal lug to provide a solder joint between the terminal lug and the internal bus bar.

19. The method of claim 11 further comprising the step of connecting the upper pan and the lower pan.

20. The method of claim 11 wherein the assembly of the photovoltaic module comprises assembling the photovoltaic module in a sunlight-tracking array.

21. A sunlight-tracking photovoltaic array, said array comprising:

a plurality of photovoltaic modules, each of said photovoltaic modules comprising:

a plurality of solar cells electrically connected in a linear series circuit having first and second opposing ends;

a support structure for said solar cells, said structure defining a conduit for the flow of air beneath said solar cells;

a first terminal bar in electrical continuity with said solar cell circuit and located at a first end of said solar cell circuit;

a second terminal bar in electrical continuity with said solar cell circuit and located at a second end of said solar cell circuit; and first and second circuit connectors in electrical continuity with said first and second terminal bars respectively;

wherein said plurality of photovoltaic modules is electrically connected one to another in at least one circuit arrangement selected from the group consisting of series arrangements and parallel arrangements by said circuit connectors; and means for individually rotating each photovoltaic module about a longitudinal axis of each module and for tracking sunlight.

* * * * *